United States Patent [19]

Itsuji

[11] Patent Number: 5,151,299
[45] Date of Patent: Sep. 29, 1992

[54] METHOD FOR FORMING A CARBON RESISTANCE IN A PRINTED WIRING BOARD

[75] Inventor: Junichi Itsuji, Saitama, Japan

[73] Assignee: Nippon CMK Corp., Japan

[21] Appl. No.: 682,913

[22] Filed: Apr. 9, 1991

[30] Foreign Application Priority Data

Apr. 17, 1990 [JP] Japan .................... 2-100630

[51] Int. Cl.$^5$ .............................................. C23C 26/00
[52] U.S. Cl. ........................................ 427/96; 427/122; 427/113; 427/270; 427/271; 427/353
[58] Field of Search ............... 427/96, 122, 353, 113, 427/270, 271, 55

[56] References Cited

U.S. PATENT DOCUMENTS

| | | | |
|---|---|---|---|
| 3,934,067 | 1/1976 | Goldman | 427/96 |
| 4,474,731 | 10/1984 | Brownlow | 427/96 |
| 4,752,415 | 6/1988 | Iwaskow | 524/440 |
| 4,849,251 | 7/1989 | Tanaka | 427/122 |

Primary Examiner—Michael Lusignan
Assistant Examiner—Vi Duong Dang
Attorney, Agent, or Firm—Bruce L. Adams; Van C. Wilks

[57] ABSTRACT

The method for forming a carbon resistance in a printed wiring board comprises, in a method for forming a carbon resistance in the circuit of a printed wiring board,
a process of depositing a thermoset carbon resistance layer coated on a laminated film on the surface of the circuit, a process of thermosetting the carbon resistance layer along the disposal position necessary for the circuit, and a process of removing the uncured layer of the carbon resistance layer from the circuit surface after the thermosetting process.

In accordance with the method for forming a carbon resistance in a printed wiring board of the present invention, thermosetting carbon resistance layer coated on a laminated film is deposited on the circuit surface of a printed wiring board and cured thereby to form a carbon resistance in the circuit, and in consequence it is possible to form a carbon resistance which always comprises a stable resistance value, without depending on the smoothness of the circuit surface or the forming conditions of the carbon resistance.

2 Claims, 1 Drawing Sheet

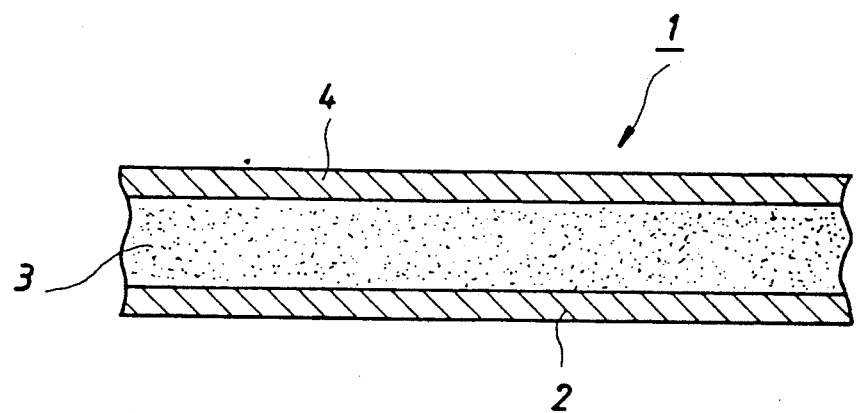

METHOD FOR FORMING A CARBON RESISTANCE IN A PRINTED WIRING BOARD

BACKGROUND OF THE INVENTION

1. Field of the Invention

The present invention is related to a method for forming a carbon resistance in the required position of a printed wiring board.

2. Prior Art

As the conventional method for forming a resistance in a printed wiring board, there has been developed a method to replace the mounting of a chip component, in which a carbon paint is printed in a printed wiring board circuit by silk screen printing and thereafter it is dried and cured.

SUMMARY OF THE INVENTION

However, if a carbon paint is printed on required position in a printed wiring board circuit by the silk screen printing, irregularities occur in the film thickness of the carbon paint due to the irregularities of the smoothness of the surface of the printed wiring board circuit and the print conditions such as the printing pressure during the silk screen printing, and thus it is difficult to obtain a stable resistance value. In addition, a blurring phenomenon occurs during the silk screen printing, and thus there is a defect such as the requirement of the correction of the blurred positions in addition to the correction of the resistance value.

Accordingly, the present invention was made in view of the above problem in the conventional method for forming a carbon resistance in a printed wiring board, and the object thereof is to provide a method for forming a carbon resistance which always has a stable resistance value.

The method for forming a carbon resistance in a printed wiring board comprises, in a method for forming a carbon resistance in the circuit of a printed wiring board, a step of depositing a thermoset carbon resistance layer coated on a laminated film on the surface of the circuit, a step of thermosetting the carbon resistance layer along the disposal position necessary for the circuit, and a process of removing the uncured layer of the carbon resistance layer from the circuit surface after the thermosetting step.

In accordance with the method for forming a carbon resistance in a printed wiring board of the present invention, the thermosetting carbon resistance layer coated on a laminated film is deposited on the circuit surface of a printed wiring board and cured thereby to form a carbon resistance in the circuit, and in consequence it is possible to form a carbon resistance which always comprises a stable resistance value, without depending on the smoothness of the circuit surface or the forming conditions of the carbon resistance.

BRIEF DESCRIPTION OF THE DRAWING

The drawing is a sectional view of the carbon resistance film which is used for the method for forming a carbon resistance in a printed wiring board of the present invention.

DESCRIPTION OF THE EMBODIMENT

Now, a particular embodiment of the method for forming a carbon resistance in a printed wiring board of the present invention is described in conjunction with the drawing.

The drawing is a sectional view of the carbon resistance film which is used for the method for forming a carbon resistance in a printed wiring board of the present invention.

Carbon resistance film 1 is formed by providing carbon resistance layer 3 comprised of a thermoset carbon paint of a required film thickness coated on laminated film 2, and covering the surface of carbon resistance layer 3 with protective film 4.

Then, after depositing the carbon resistance film 1 on the printed wiring circuit surface of a printed wiring board (not shown) wherein a required printed wiring circuit is formed on the surface or both sides of a substrate, carbon resistance layer 3 of the carbon resistance film 1 is exposed to infrared or far infrared rays so as to be thermoset along the disposal position where a carbon resistance (not shown) is to be formed in the printed wiring circuit, thereby enabling the carbon resistance (not shown) to be formed in the required position in the printed wiring circuit.

Thereafter, protective film 4 of carbon resistance film 1 is peeled off and the uncured portion of carbon resistance layer 3 is removed by applying a removal process such as water washing.

After the formation of such carbon resistance, other processes required for forming a printed wiring board are performed such as the formation of an insulating layer.

In addition to the use of single film of a required size as the carbon resistance film 1, it can be formed as an endless film so that it can be continuously deposited on the printed wiring circuit surface of printed wiring boards with respect to a plurality of printed wiring boards, thereby enabling the formation method of the present invention to be implemented by a continuous work.

As apparent form the above description, in accordance with the present invention, a carbon resistance can be formed which always has a stable resistance value.

What is claimed is:

1. A method for forming a carbon resistance in the circuit of a printed wiring board, comprising the steps of:

depositing a thermosettable carbon resistance layer coated on a laminated film on the surface of said circuit, thermosetting areas of said carbon resistance layer at given positions for said circuit with the remaining areas uncured, and removing the uncured areas of said carbon resistance layer after thermosetting.

2. A method for forming carbon resistors for a circuit of a printed circuit board, comprising the steps of:

disposing a layer of thermosettable carbon resistance paint on a laminated film;

thermosetting areas of the carbon resistance paint at given positions corresponding to a circuit on a printed circuit board with remaining areas uncured; and removing the remaining uncured areas after thermosetting.

* * * * *